(12) United States Patent
Chen et al.

(10) Patent No.: US 12,477,740 B2
(45) Date of Patent: Nov. 18, 2025

(54) SEMICONDUCTOR MEMORY STRUCTURE AND FABRICATION METHOD THEREOF

(71) Applicant: UNITED MICROELECTRONICS CORP., Hsin-Chu (TW)

(72) Inventors: Zhen Chen, Singapore (SG); Wei Cheng, Singapore (SG); Kok Wun Tan, Singapore (SG); Shen-De Wang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 656 days.

(21) Appl. No.: 17/502,015

(22) Filed: Oct. 14, 2021

(65) Prior Publication Data

US 2023/0099289 A1    Mar. 30, 2023

(30) Foreign Application Priority Data

Sep. 24, 2021 (CN) .......................... 202111119875.X (51) Int. Cl.
*H10B 43/35*      (2023.01)
*H10B 41/35*      (2023.01)
*H10D 62/10*      (2025.01)

(52) U.S. Cl.
CPC .............. *H10B 43/35* (2023.02); *H10B 41/35* (2023.02); *H10D 62/115* (2025.01)

(58) Field of Classification Search
CPC ........... H01L 29/42676; H01L 29/4234; H01L 29/42364; H01L 29/42368; H01L 29/42376; H01L 29/42344; H01L 29/40117; H01L 29/4238; H01L 29/42372; H01B 43/35; H01B 43/30
See application file for complete search history.

(56) References Cited

U.S. PATENT DOCUMENTS

| | | | |
|---|---|---|---|
| 6,797,557 B2 | 9/2004 | Chiang | |
| 6,881,619 B1 * | 4/2005 | Lee | H01L 29/66833 438/791 |
| 7,006,378 B1 * | 2/2006 | Saito | G11C 16/0475 365/185.26 |
| 9,818,747 B2 | 11/2017 | Smayling | |
| 10,340,282 B1 | 7/2019 | Yu | |
| 2016/0365309 A1 * | 12/2016 | Zhang | H01L 29/78 |
| 2018/0090508 A1 * | 3/2018 | Ogata | H01L 29/42344 |

(Continued)

FOREIGN PATENT DOCUMENTS

| | | |
|---|---|---|
| JP | 10-321838 A | 12/1998 |
| JP | 2018-32743 A | 3/2018 |
| JP | 2018-56222 A | 4/2018 |

*Primary Examiner* — Jessica S Manno
*Assistant Examiner* — Ricky Verdes
(74) *Attorney, Agent, or Firm* — Winston Hsu (57) ABSTRACT

A semiconductor memory structure includes a substrate having a device cell region and a contact forming region in proximity to the device cell region. A memory cell transistor is disposed within the device cell region. The memory cell transistor includes a gate and a charge storage structure between the gate and the substrate. The gate includes an extended portion within the contact forming region. A first spacer is disposed on a sidewall of the gate within the device cell region. A second spacer is disposed on a sidewall of the extended portion of the gate within the contact forming region. The second spacer is higher than the first spacer.

6 Claims, 7 Drawing Sheets

(56) References Cited

U.S. PATENT DOCUMENTS

2018/0286956 A1* 10/2018 Xie ................... H01L 21/76897
2018/0366472 A1* 12/2018 Wu ..................... H01L 27/1237
2021/0257474 A1*  8/2021 Lee ....................... H01L 21/845

* cited by examiner

SEMICONDUCTOR MEMORY STRUCTURE AND FABRICATION METHOD THEREOF

BACKGROUND OF THE INVENTION

1. Field of the Invention

The present invention relates to the field of semiconductor technology, in particular to semiconductor memory structures and manufacturing methods thereof.

2. Description of the Prior Art

Existing memory systems, such as semiconductor-oxide-nitride-oxide-semiconductor (SONOS) non-volatile memory, usually have gate extensions in the contact forming region at the gate end of the device cell region for electrically connecting with the contact structures.

Before forming the contact hole in the contact forming region, the silicon nitride capping layer on the extensions of the contact forming region is usually removed by using a lithographic process and an etching process. Therefore, the height of the extensions in the contact forming region is smaller than the height of the gate in the device cell region. In addition, to increase the process margin, the extensions in the contact forming region has a larger gate length than the gate in the device cell region.

One disadvantage of the above-mentioned prior art is that when the contact holes are defined by the lithographic process and the etching process, there may be a position offset from the active area below, which is also called AA offset. Since the over-etched amount of the polysilicon contact hole is usually more than the over-etched amount of the contact holes on the diffusion region, defects such as spacer etch through may occur.

Further, in the prior art, the height of the gate is about 2900 angstroms (the total height of the polysilicon layer with a thickness of 1800 angstroms and the silicon nitride capping layer with a thickness of 1100 angstroms), and the height of the sidewalls is also relatively high. The width of the gap between the electrodes is getting smaller and smaller, resulting in a larger aspect ratio for the gap between the gates. The gap between the gates is not easy to be completely filled by the dielectric layer, thus forming void, so that when the contact hole is filled with metal, a contact bridging problem may occur, which reduces the process yield.

SUMMARY OF THE INVENTION

It is one objective of the present invention to provide an improved semiconductor memory structure and manufacturing method thereof to solve the deficiencies or shortcomings of the prior art.

One aspect of the invention provides a semiconductor memory structure including a substrate having thereon a device cell region and a contact forming region in proximity to the device cell region; and a memory cell transistor disposed on the substrate within the device cell region. The memory cell transistor includes a gate and a charge storage structure between the gate and the substrate. The gate includes an extended portion within the contact forming region. A first spacer is disposed on a sidewall of the gate within the device cell region. The first spacer has a first spacer height. A second spacer is disposed on a sidewall of the extended portion of the gate within the contact forming region. The second spacer has a second spacer height that is greater than the first spacer height.

According to some embodiments, the contact forming region is a trench isolation region and is contiguous with the device cell region.

According to some embodiments, the extended portion of the gate is disposed directly on the trench isolation region.

According to some embodiments, the extended portion within the contact forming region has a gate length that is equal to that of the gate within the device cell region.

According to some embodiments, the charge storage structure comprises an oxide-nitride-oxide (ONO) film.

According to some embodiments, the semiconductor memory structure further includes a contact etch stop layer covering the extended portion within the contact forming region and the gate within the device cell region; and an inter-layer dielectric layer covering the contact etch stop layer within the contact forming region and the device cell region.

According to some embodiments, the contact etch stop layer comprises silicon carbide.

According to some embodiments, the semiconductor memory structure further includes a contact plug in the inter-layer dielectric layer and is in direct contact with the extended portion of the gate within the contact forming region. The contact plug is wrapped around by the contact etch stop layer.

Another aspect of the invention provides a method of forming a semiconductor memory structure. A substrate having thereon a device cell region and a contact forming region in proximity to the device cell region is provided. A memory cell transistor is formed on the substrate within the device cell region. The memory cell transistor includes a gate and a charge storage structure between the gate and the substrate. The gate comprises an extended portion within the contact forming region. A first spacer is formed on a sidewall of the gate within the device cell region. The first spacer has a first spacer height. A second spacer is formed on a sidewall of the extended portion of the gate within the contact forming region. The second spacer has a second spacer height that is greater than the first spacer height.

According to some embodiments, the contact forming region is a trench isolation region and is contiguous with the device cell region.

According to some embodiments, the extended portion of the gate is disposed directly on the trench isolation region.

According to some embodiments, the extended portion within the contact forming region has a gate length that is equal to that of the gate within the device cell region.

According to some embodiments, the charge storage structure comprises an oxide-nitride-oxide (ONO) film.

According to some embodiments, a contact etch stop layer is formed to cover the extended portion within the contact forming region and the gate within the device cell region. An inter-layer dielectric layer is formed to cover the contact etch stop layer within the contact forming region and the device cell region.

According to some embodiments, the contact etch stop layer comprises silicon carbide.

According to some embodiments, a contact plug is formed in the inter-layer dielectric layer. The contact plug is in direct contact with the extended portion of the gate within the contact forming region. The contact plug is wrapped around by the contact etch stop layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
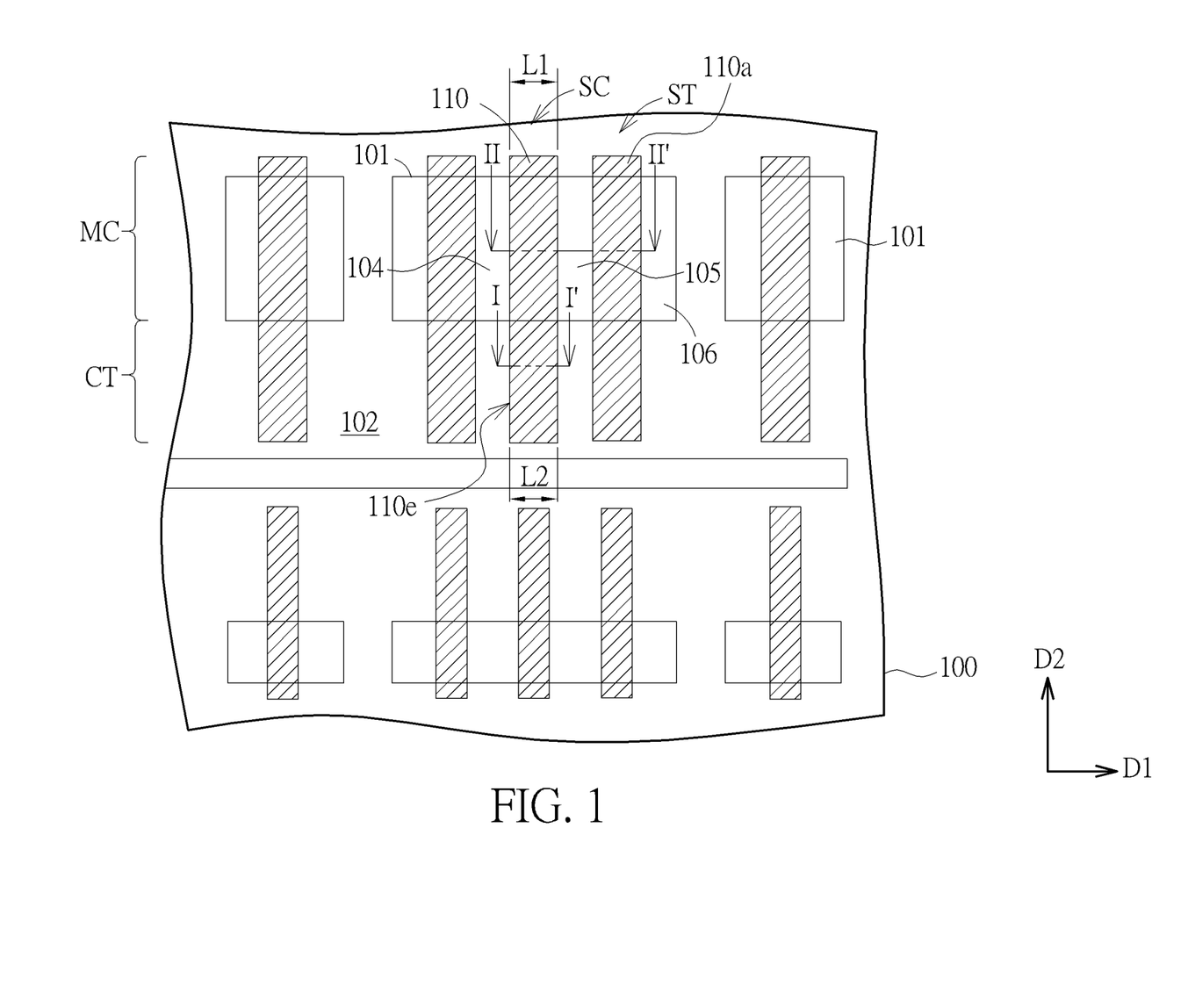
FIG. 1 is a schematic diagram showing a partial layout of a semiconductor memory structure according to an embodiment of the present invention.
Figure 2:
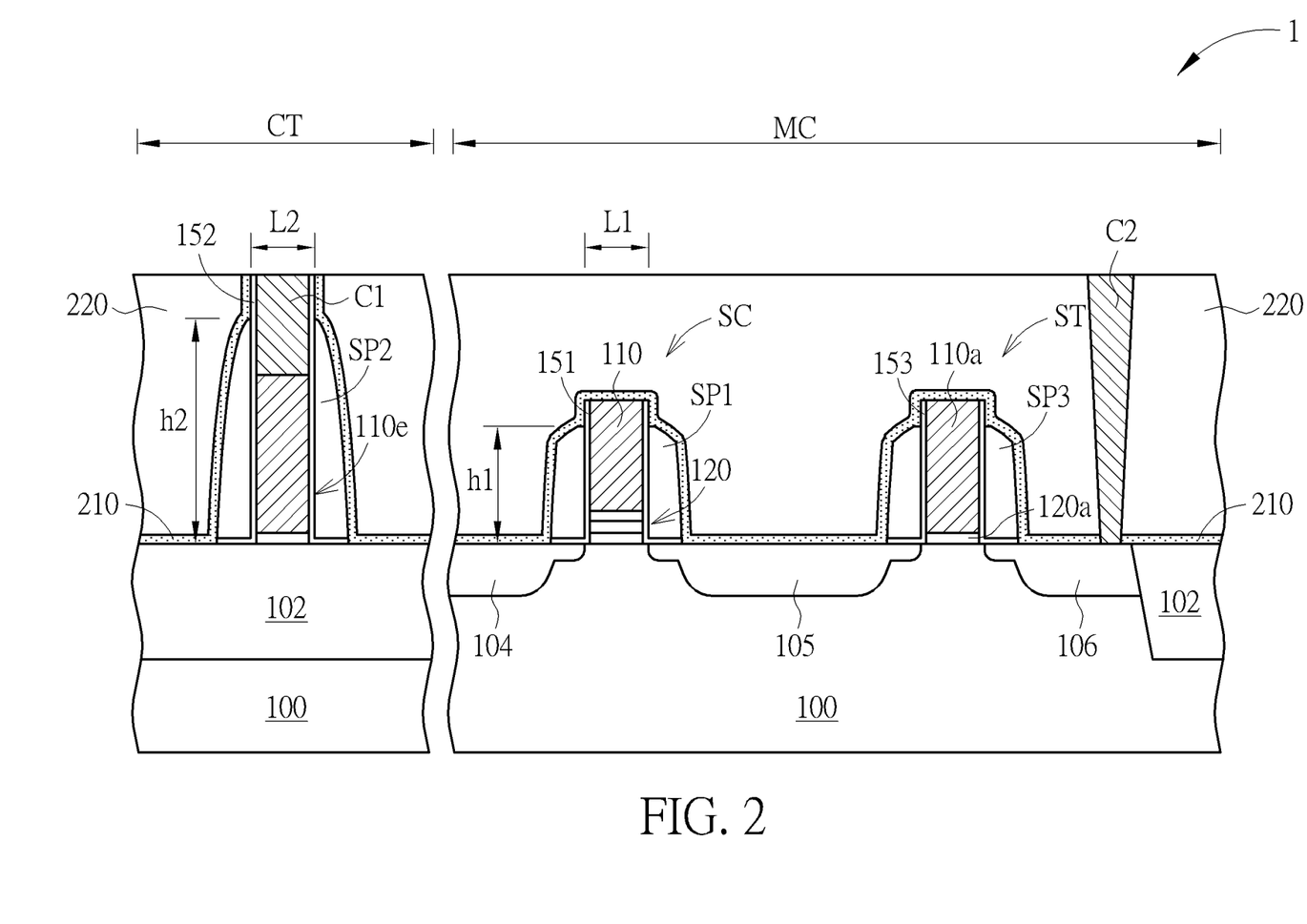
FIG. 2 is a schematic cross-sectional diagram of the semiconductor memory structure taken along lines I-I' and II-IF in FIG. 1.

Please refer to FIG. 1 and FIG. 2. FIG. 1 is a schematic diagram showing a partial layout of a semiconductor memory structure according to an embodiment of the present invention. FIG. 2 is a schematic cross-sectional diagram of the semiconductor memory structure taken along lines I-I' and II-IF in FIG. 1. As shown in FIG. 1 and FIG. 2, the semiconductor memory structure 1 includes a substrate 100, such as a P-type silicon substrate, but is not limited thereto. The substrate 100 has a device cell region MC and a contact forming region CT in proximity to the device cell region MC.

According to an embodiment of the present invention, the substrate 100 includes an active area 101 extending along the first direction D1 and a trench isolation region 102 surrounding the active area 101. According to an embodiment of the present invention, the contact forming region CT is located on the trench isolation region 102 and is contiguous with the device cell region MC.

According to an embodiment of the present invention, the semiconductor memory structure 1 further includes a memory cell transistor SC disposed on the substrate 100 in the device cell region MC. According to an embodiment of the present invention, the memory cell transistor SC includes a gate 110 extending along the second direction D2 and a charge storage structure 120 between the gate 110 and the substrate 100. According to an embodiment of the present invention, the second direction D2 is orthogonal to the first direction D1.

According to an embodiment of the present invention, for example, the gate 110 may include a polysilicon gate, and the charge storage structure 120 may include an oxide-nitride-oxide (ONO) film. According to an embodiment of the present invention, the memory cell transistor SC further includes diffusion regions 104 and 105 disposed in the substrate 100, for example, $N^+$ diffusion regions, which serve as the source or drain of the memory cell transistor SC.

According to an embodiment of the present invention, the gate 110 includes an extended portion 110e located in the contact forming region CT. According to an embodiment of the present invention, the extended portion 110e is located at the end of the gate 110 and extends into the contact forming region CT along the second direction D2. According to an embodiment of the present invention, the extended portion 110e is directly disposed on the trench isolation region 102.

According to an embodiment of the present invention, the semiconductor memory structure 1 further includes a transistor ST, for example, as a select transistor, but not limited thereto. According to an embodiment of the present invention, the transistor ST may be connected in series with the memory cell transistor SC, for example, through the shared diffusion region 105. According to an embodiment of the present invention, the transistor ST includes a gate 110a and a gate dielectric layer 120a. According to an embodiment of the present invention, for example, the gate 110a may include a polysilicon gate, and the gate dielectric layer 120a may include a silicon oxide film. According to an embodiment of the present invention, the transistor ST further includes a diffusion region 106, for example, an $N^+$ diffusion region.

According to an embodiment of the present invention, the semiconductor memory structure 1 further includes a first spacer SP1 disposed on the sidewall of the gate 110 in the device cell region MC. The semiconductor memory structure 1 further includes a second spacer SP2 disposed on the sidewall of the extended portion 110e of the gate 110 in the contact forming region CT. The semiconductor memory structure 1 further includes a third spacer SP3 disposed on the sidewall of the gate 110a. According to an embodiment of the present invention, the first spacer SP1, the second spacer SP2, and the third spacer SP3 may be silicon nitride spacers, but are not limited thereto.

According to an embodiment of the present invention, a thin oxide layer 151 may be provided between the first spacer SP1 and the gate 110, a thin oxide layer 152 may be provided between the second spacer SP2 and the gate 110e, and a thin oxide layer 153 may be provided between the third spacer SP3 and the gate 110a for isolation. In addition, a thin oxide layer may be used in the silicon nitride capping layer on the gate 110e to protect the second spacer SP2 from being affected during the hot phosphoric acid wet etching process.

According to an embodiment of the present invention, the first spacer SP1 has a first height h1, and the second spacer SP2 has a second height h2. According to an embodiment of the present invention, the second height h2 of the second spacer SP2 is higher than the first height h1 of the first spacer SP1.

According to an embodiment of the present invention, the gate 110 of the memory cell transistor SC has a gate length L1 in the first direction D1 in the device cell region MC, and the extended portion 110e has a gate length L2 in the first direction D1 in the contact forming region CT. According to an embodiment of the present invention, the gate length L2 of the extended portion 110e in the contact forming region CT is equal to the gate length L1 of the gate 110 in the device cell region MC.

According to an embodiment of the present invention, as shown in FIG. 2, the semiconductor memory structure 1 further includes a contact etch stop layer 210 covering the extended portion 110e in the contact forming region CT and the gates 110 and 110a in the device cell region MC. According to an embodiment of the present invention, the contact etch stop layer 210 includes silicon carbide.

According to an embodiment of the present invention, the semiconductor memory structure 1 further includes an interlayer dielectric layer 220, such as a silicon oxide film or a low dielectric constant (low-k) material, covering the contact etch stop layer 210 in the contact forming region CT and the device cell region MC.

According to an embodiment of the present invention, the semiconductor memory structure 1 further includes a contact plug C1 located in the interlayer dielectric layer 220 and in direct contact with the extended portion 110e in the contact forming region CT. The contact plug C1 is wrapped around by the contact etch stop layer 210. According to an embodiment of the present invention, the semiconductor memory structure 1 further includes a contact plug C2 located in the interlayer dielectric layer 220 in the device cell region MC and in direct contact with the diffusion region 106. According to an embodiment of the present invention, the contact plug C2 penetrates through the interlayer dielectric layer 220 and the contact etch stop layer 210.

Figure 3:
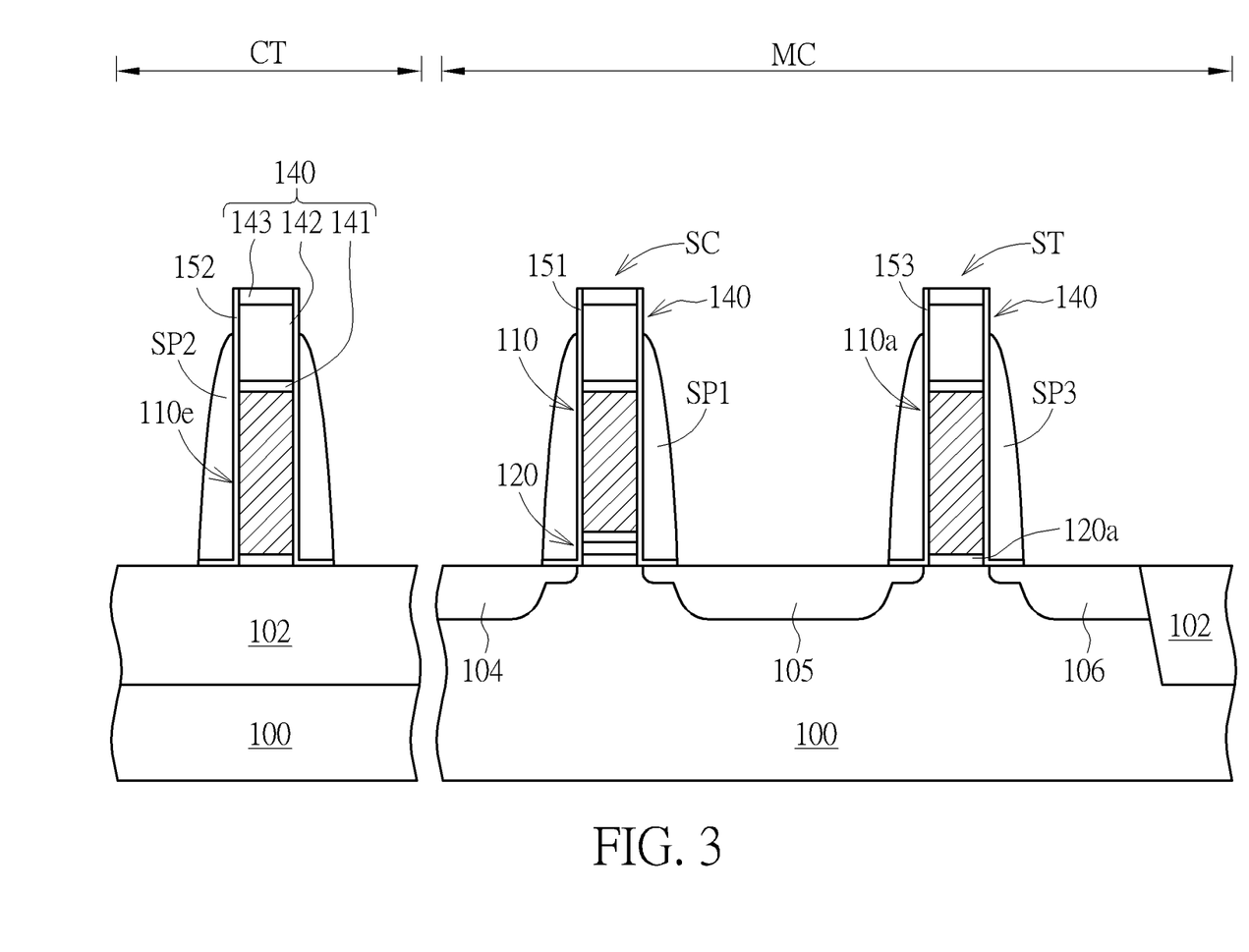
FIG. 3 to FIG. 7 are schematic diagrams showing a method for forming a semiconductor memory structure according to an embodiment of the present invention.

Please refer to FIG. 3 to FIG. 7, which are schematic diagrams showing a method for forming a semiconductor memory structure according to an embodiment of the present invention, wherein like regions, layers or elements are designated by like numeral numbers or labels As shown in FIG. 3, a substrate 100 is provided, for example, a P-type silicon substrate, but not limited thereto. The substrate 100 includes a device cell region MC and a contact forming region CT in proximity to the device cell region MC. According to an embodiment of the present invention, the substrate 100 includes an active area 101 and a trench isolation region 102 surrounding the active area 101. According to an embodiment of the present invention, the contact forming region CT is located on the trench isolation region 102 and is contiguous with the device cell region MC.

Subsequently, a memory cell transistor SC is formed on the substrate 100 in the device cell region MC. The memory cell transistor SC includes a gate 110 and a charge storage structure 120 located between the gate 110 and the substrate 100. According to an embodiment of the present invention, the gate 110 includes an extended portion 110e located in the contact forming region CT. According to an embodiment of the present invention, for example, the gate 110 may include a polysilicon gate, and the charge storage structure 120 may include an oxide-nitride-oxide (ONO) film. According to an embodiment of the present invention, the memory cell transistor SC further includes diffusion regions 104 and 105 disposed in the substrate 100, for example, $N^+$ diffusion regions, which serve as the source or drain of the memory cell transistor SC.

In addition, a transistor ST is formed on the substrate 100 in the device cell region MC, for example, as a select transistor, but not limited thereto. According to an embodiment of the present invention, the transistor ST can be connected in series with the memory cell transistor SC, for example, through the shared diffusion region 105. According to an embodiment of the present invention, the transistor ST includes a gate 110a and a gate dielectric layer 120a. According to an embodiment of the present invention, for example, the gate 110a may include a polysilicon gate, and the gate dielectric layer 120a may include a silicon oxide film. According to an embodiment of the present invention, the transistor ST further includes a diffusion region 106, for example, an $N^+$ diffusion region.

According to an embodiment of the present invention, a top structure 140 is formed on the gate 110, the gate 110a and the extended portion 110e. For example, the top structure 140 may include a lower silicon oxide layer 141, a silicon nitride capping layer 142, and an upper silicon oxide layer 143.

Subsequently, a first spacer SP1 is formed on the sidewall of the gate 110 in the device cell region MC, a second spacer SP2 is formed on the sidewall of the extended portion 110e in the contact forming region CT, and at the same time in the device cell region MC, a third sidewall sub SP3 is formed on the sidewall of the gate 110a. According to an embodiment of the present invention, the first spacer SP1, the second spacer SP2, and the third spacer SP3 may be silicon nitride spacers, but are not limited thereto.

According to an embodiment of the present invention, a thin oxide layer 151 may be provided between the first spacer SP1 and the silicon nitride capping layer 142 and between the first spacer SP1 and the gate 110 for isolation, and a thin oxide layer 152 may be provided between the second spacer SP2 and the gate 110e. A thin oxide layer 153 may be provided between the third spacer SP3 and the gate 110a for isolation. The thin oxide layers 151-153 can be formed by rapid thermal oxidation (RTO) or in-situ steam generation (ISSG) oxidation (the sidewalls of the silicon nitride capping layer 142 can be simultaneously oxidized), or can be formed by chemical vapor deposition (CVD) or the furnace high-temperature oxidation (HTO).

Figure 4:
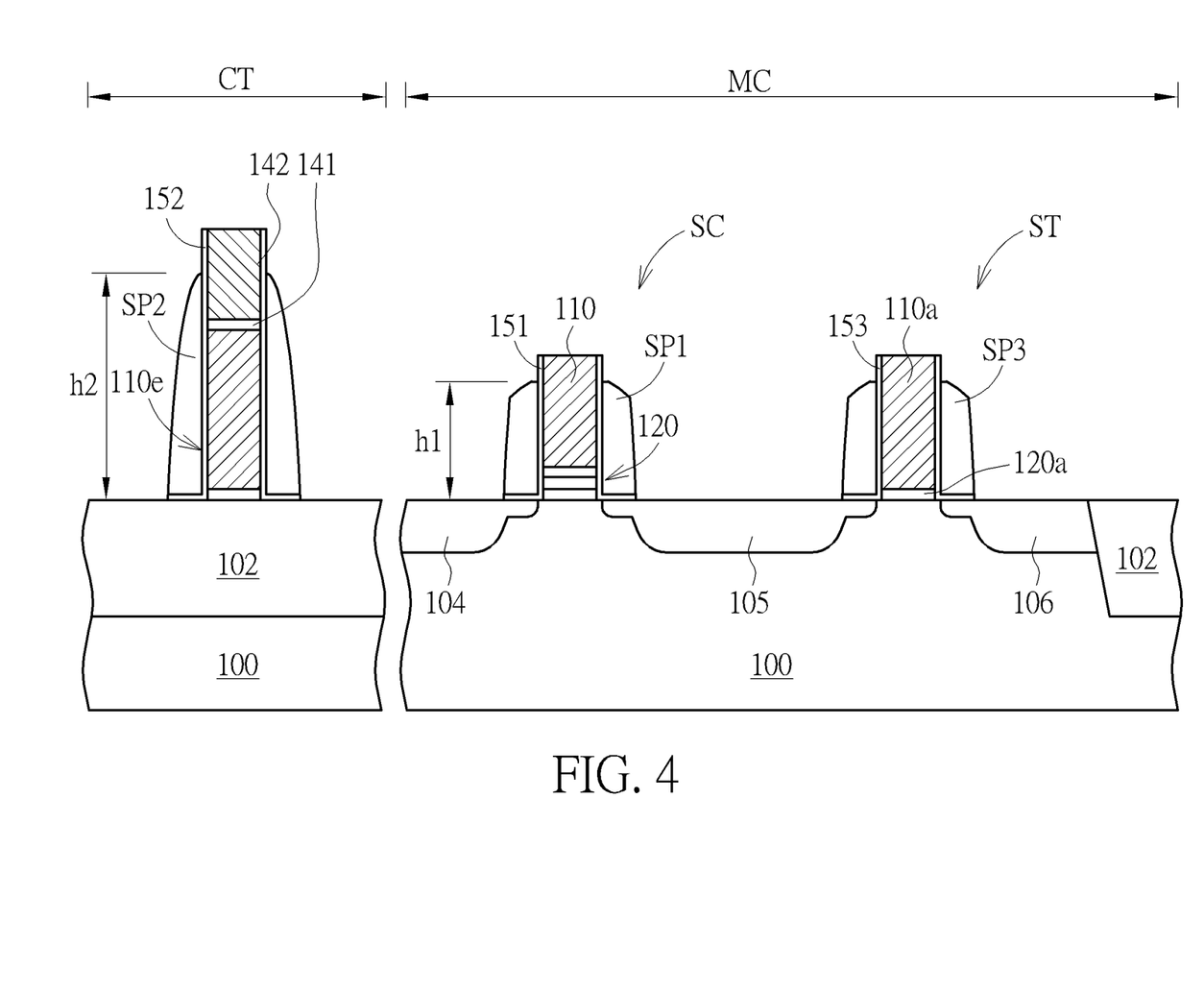

As shown in FIG. 4, a lithographic process and an etching process are performed, and the extended portion 110e in the contact forming region CT is covered with a photoresist pattern (not shown), and only the gate 110 in the device cell region MC is exposed. The top structures 140 on the gate 110 and gate 110a in the device cell region MC are then removed, and at the same time, the first spacer SP1 and the third spacer SP3 on the sidewalls of the gate 110 and gate 110a are partially etched or trimmed. This simultaneously reduces the height of the first spacer SP1 and the third spacer SP3. At this point, the first spacer SP1 and the third spacer SP3 have a first height h1, and the second spacer SP2 has a second height h2, which is higher than the first height h1. According to an embodiment of the present invention, the upper silicon oxide layer 143 on the extended portion 110e and the lower silicon oxide layer 141 on the gate 110 and gate 110a can be removed during a cleaning process.

The present invention removes and the top structures 140 on the gate 110 and gate 110a in the device cell region MC, and etches a part of the first spacer SP1 and the third spacer SP3, so that the height of the first spacer SP1 and the third spacer SP3 is reduced, and the thickness of the first spacer SP1 and the third spacer SP3 becomes thinner, so as to improve the process margin of the subsequent filling of the interlayer dielectric layer.

Figure 5:
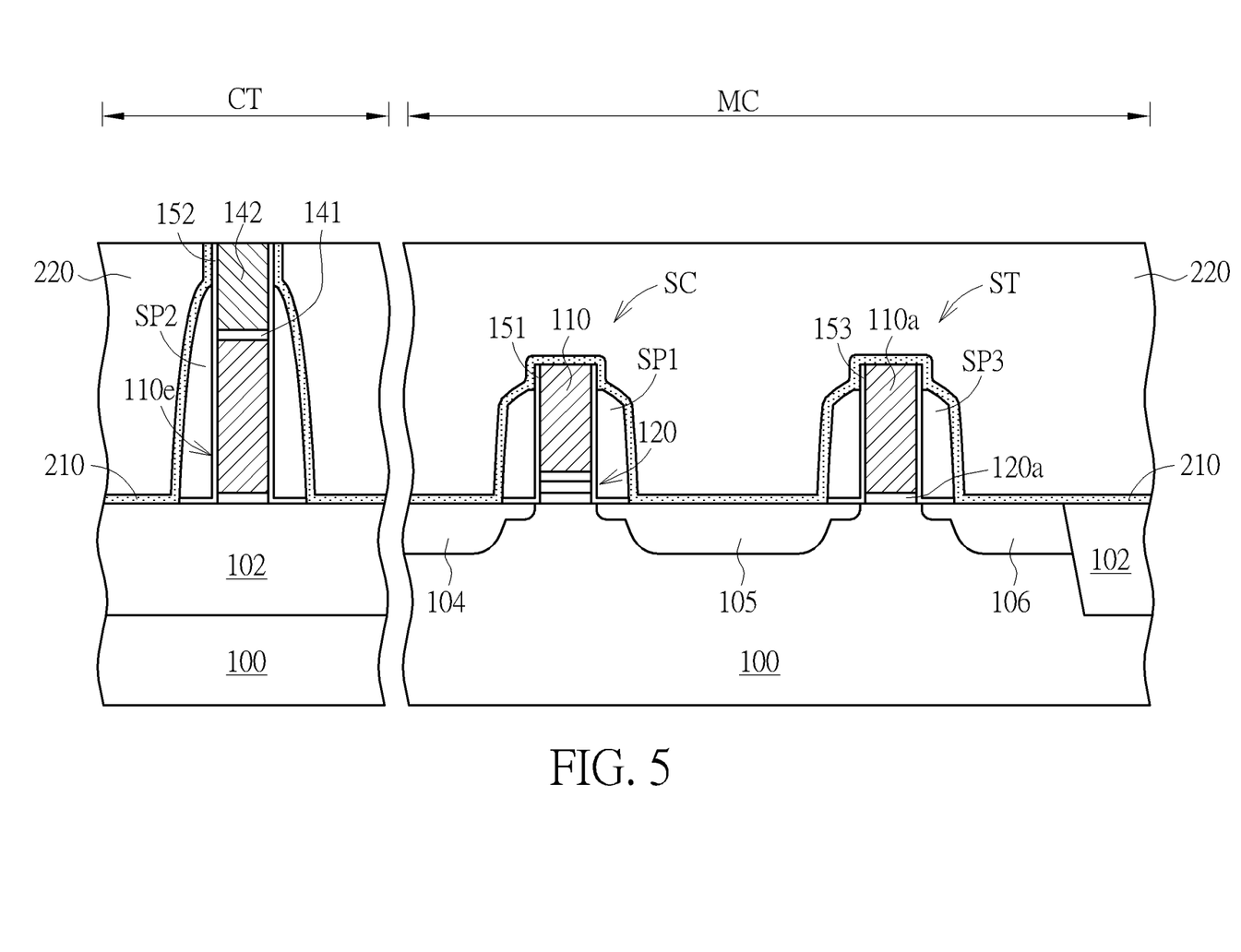

As shown in FIG. 5, a chemical vapor deposition (CVD) process can then be performed to deposit a contact etch stop layer 210 in a blanket manner to conformally cover the extended portion 110e in the contact forming region CT and the gates 110 and 110a in the device cell region MC. According to an embodiment of the present invention, the contact etch stop layer 210 may be a silicon carbide layer. An interlayer dielectric layer 220, such as a silicon oxide film or a low-k material, is then blanket deposited in the contact forming region CT and the device cell region MC to cover the contact etch stop layer 210.

Subsequently, a chemical mechanical polishing (CMP) process can be performed to planarize the interlayer dielectric layer 220, and polish away the contact etch stop layer 210 directly above the extended portion 110e in the contact forming region CT, revealing the silicon nitride capping layer 142 above the extended portion 110e in the contact forming region CT.

Figure 6:
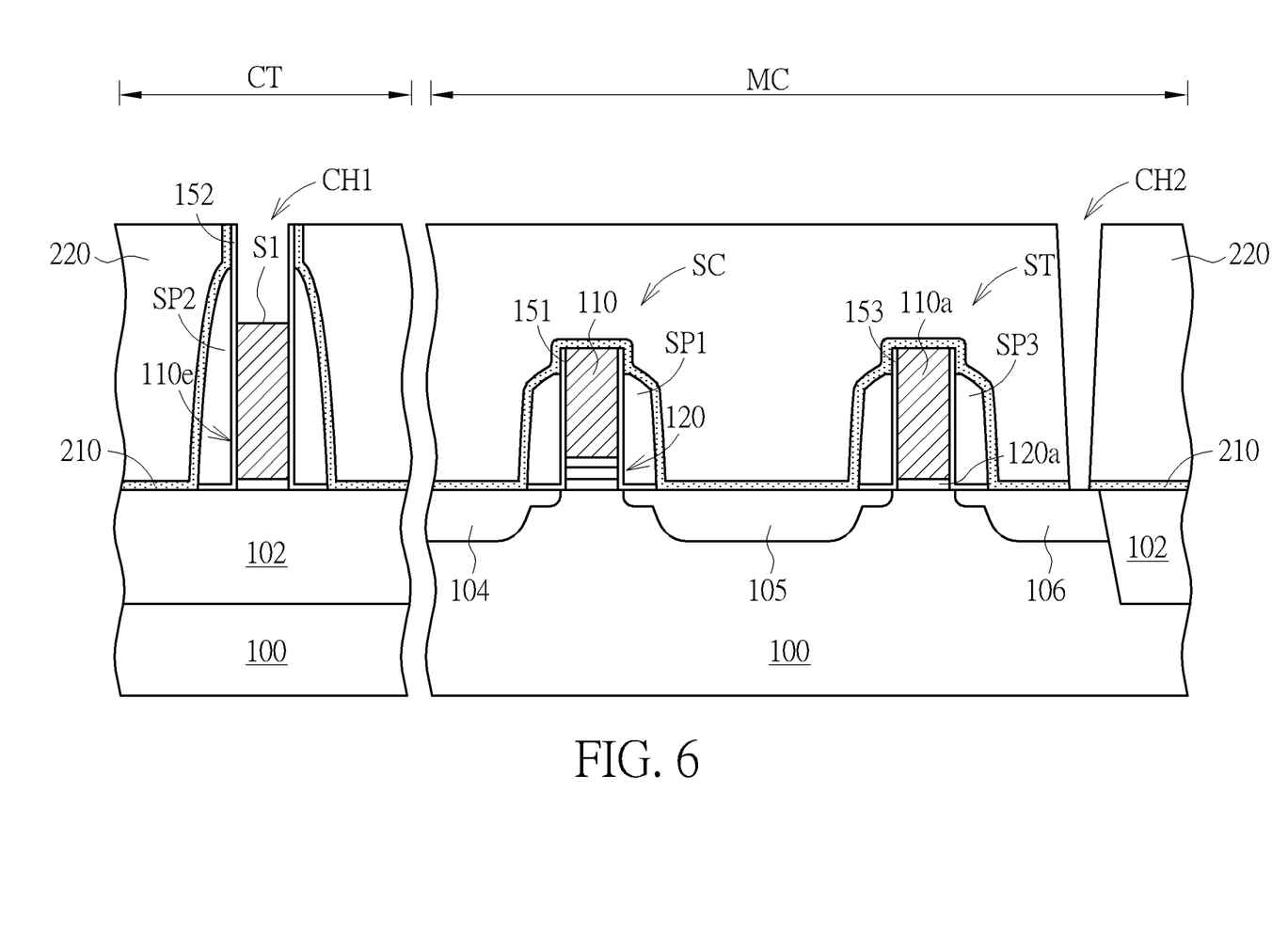

As shown in FIG. 6, a wet etching process, for example, a hot phosphoric acid solution, is used to remove the silicon nitride capping layer 142 above the extended portion 110e in the contact forming region CT, and the lower silicon oxide layer 141 may be removed in the subsequent cleaning steps, thereby forming a contact hole CH1 above the extended portion 110e in the contact forming region CT in a self-aligned manner, which exposes the top surface 51 of the extended portion 110e. Subsequently, a lithographic process and an etching process can be performed to form a contact hole CH2 in the interlayer dielectric layer 220 and the contact etch stop layer 210 in the device cell region MC, which exposes a part of the diffusion region 106.

Figure 7:
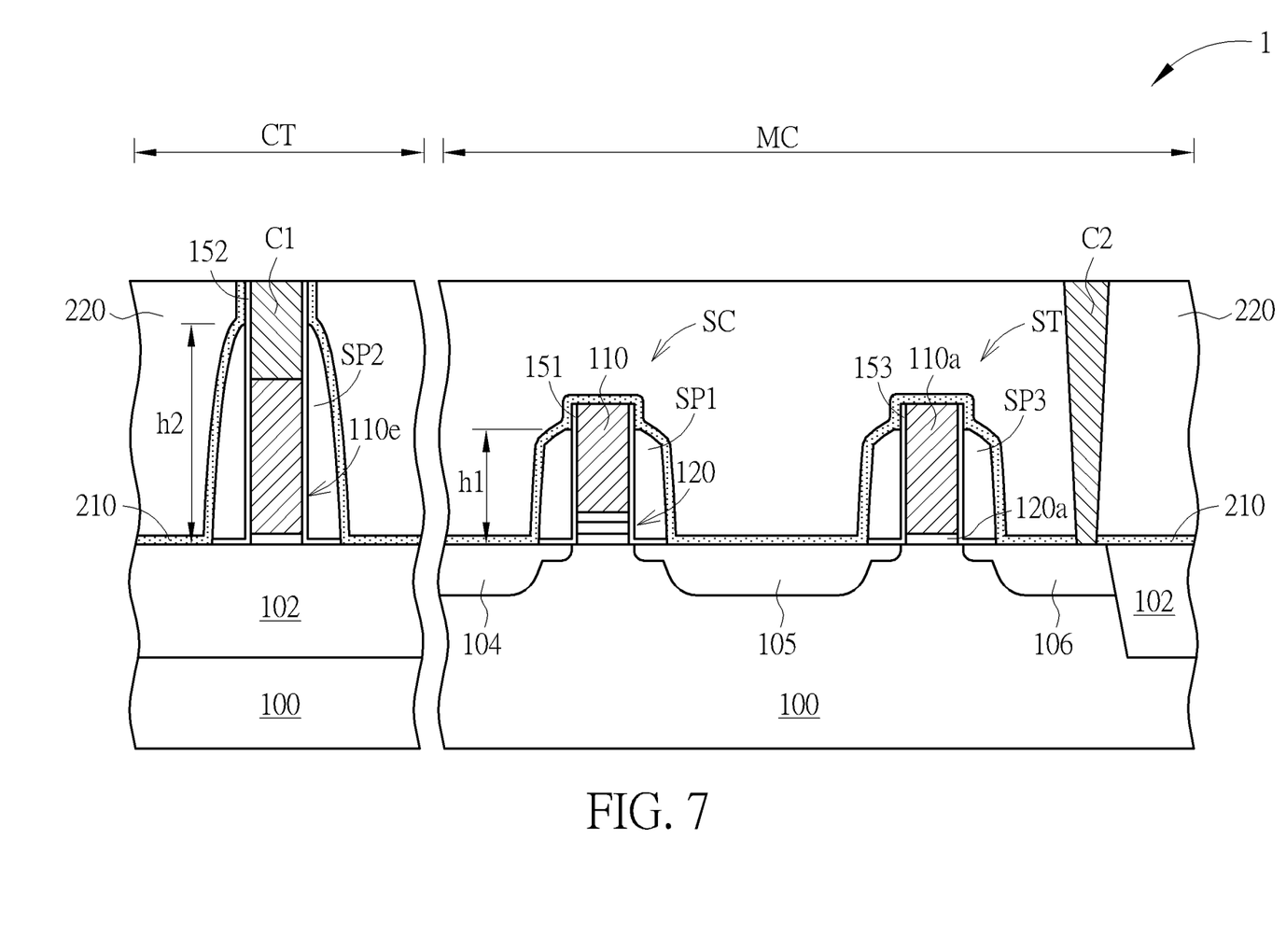

As shown in FIG. 7, a contact plug C1 and a contact plug C2 are formed in the contact hole CH1 and the contact hole CH2 in the interlayer dielectric layer 220, respectively. For example, a tungsten metal layer is deposited in a blanket manner, filled into the contact holes CH1 and the contact holes CH2, and then the tungsten metal layer may be planarized by using a chemical mechanical polishing process. The contact plug C1 directly contacts the extended portion 110e of the gate 110 in the contact forming region CT. According to an embodiment of the present invention, the contact plug C1 is surrounded or wrapped around by the contact etch stop layer 210.

One advantage of the present invention is that the contact plug C1 is formed in a self-aligned fashion, for example, by using a hot phosphoric acid solution that selectively removes the silicon nitride capping layer 142 above the extended portion 110e in the contact forming region CT to form the contact hole CH1, which is then filled with a tungsten metal layer. In addition, the contact hole CH2 in the device cell region MC and the contact hole CH1 in the contact forming region CT are formed separately using different process steps. Therefore, the present invention can overcome the problem of over-etching of contact holes caused by AA offset in the prior art, which easily leads to spacer etch through defects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory structure, comprising:
    a substrate having thereon a device cell region and a contact forming region in proximity to the device cell region;
    a memory cell transistor disposed on the substrate within the device cell region, wherein the memory cell transistor comprises a polysilicon gate and a charge storage structure between the polysilicon gate and the substrate, wherein the polysilicon gate comprises an extended portion within the contact forming region;
    a first spacer on a sidewall of the gate within the device cell region, wherein the first spacer has a first spacer height;
    a second spacer on a sidewall of the extended portion of the gate within the contact forming region, wherein the second spacer has a second spacer height that is greater than the first spacer height;
    a contact etch stop layer covering the extended portion within the contact forming region and the polysilicon gate within the device cell region;
    an inter-layer dielectric layer covering the contact etch stop layer within the contact forming region and the device cell region;
    a tungsten contact plug in the inter-layer dielectric layer and is in direct contact with the extended portion of the polysilicon gate within the contact forming region, wherein the tungsten contact plug is wrapped around by the contact etch stop layer; and
    an oxide layer disposed between the extended portion of the gate and the second spacer, wherein the oxide layer extends upwardly to a sidewall of the tungsten contact plug and is in direct contact with the contact etch stop layer.

2. The semiconductor memory structure according to claim 1, wherein the contact forming region is a trench isolation region and is contiguous with the device cell region.

3. The semiconductor memory structure according to claim 2, wherein the extended portion of the gate is disposed directly on the trench isolation region.

4. The semiconductor memory structure according to claim 1, wherein the extended portion within the contact forming region has a gate length that is equal to that of the gate within the device cell region.

5. The semiconductor memory structure according to claim 1, wherein the charge storage structure comprises an oxide-nitride-oxide (ONO) film.

6. The semiconductor memory structure according to claim 1, wherein the contact etch stop layer comprises silicon carbide.

* * * * *